(12) United States Patent
Ata et al.

(10) Patent No.: US 8,803,278 B2
(45) Date of Patent: Aug. 12, 2014

(54) SEMICONDUCTOR DEVICE

(75) Inventors: Yasuo Ata, Tokyo (JP); Takahiro Okuno, Tokyo (JP); Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 283 days.

(21) Appl. No.: 13/078,439

(22) Filed: Apr. 1, 2011

(65) Prior Publication Data
US 2011/0298081 A1  Dec. 8, 2011

(30) Foreign Application Priority Data
Jun. 7, 2010  (JP) .................................. 2010-129535

(51) Int. Cl.
  *H01L 29/02* (2006.01)
(52) U.S. Cl.
  USPC .................. 257/496; 257/734; 257/E29.111; 257/E29.005
(58) Field of Classification Search
  USPC ................. 257/496, E29.005, E29.111, 734
  See application file for complete search history.

(56) References Cited

U.S. PATENT DOCUMENTS

| | | | |
|---|---|---|---|
| 6,407,413 B1 * | 6/2002 | Kawamoto ..................... | 257/133 |
| 6,849,957 B2 | 2/2005 | Takeuchi et al. | |
| 6,984,876 B2 | 1/2006 | Kime et al. | |
| 8,187,897 B2 | 5/2012 | Cohn et al. | |
| 2007/0278672 A1 * | 12/2007 | Tooi et al. ..................... | 257/734 |
| 2008/0105971 A1 * | 5/2008 | Okuda et al. .................. | 257/737 |
| 2009/0026932 A1 * | 1/2009 | Kwak et al. ................... | 313/504 |

FOREIGN PATENT DOCUMENTS

| | | |
|---|---|---|
| CN | 166484 A | 9/2005 |
| CN | 1664841 A | 9/2005 |
| EP | 0 623 908 A1 | 11/1994 |
| EP | 1 921 490 A1 | 5/2008 |
| JP | 61-84824 A | 4/1986 |
| JP | 11/45839 | 2/1999 |
| JP | 11-135391 A | 5/1999 |
| JP | 2004-72075 | 3/2004 |

OTHER PUBLICATIONS

Office Action issued Dec. 21, 2012 in German Patent Application No. 10 2011 076 883.1 (with English-language translation).
Chinese Office Action dated Mar. 25, 2013, in Chinese Patent Application No. 201110148984.4 (with partial English translation).
Office Action issued on Oct. 21, 2013 in the corresponding Chinese Patent Application No. 201110148984.4 (with English Translation).
Office Action dated May 5, 2014, issued in counterpart Chinese Application No. 201110148984.4, with partial English translation.

* cited by examiner

*Primary Examiner* — Timor Karimy
(74) *Attorney, Agent, or Firm* — Oblon, Spivak, McClelland, Maier & Neustadt, L.L.P.

(57) ABSTRACT

A semiconductor device includes a semiconductor substrate, a surface electrode formed on the semiconductor substrate, an ineffective region formed to surround the surface electrode, and an ID-indicating portion made of a different material than the surface electrode and formed on the surface electrode to indicate an ID. The area of the ineffective region is smaller than the area of the surface electrode.

7 Claims, 4 Drawing Sheets

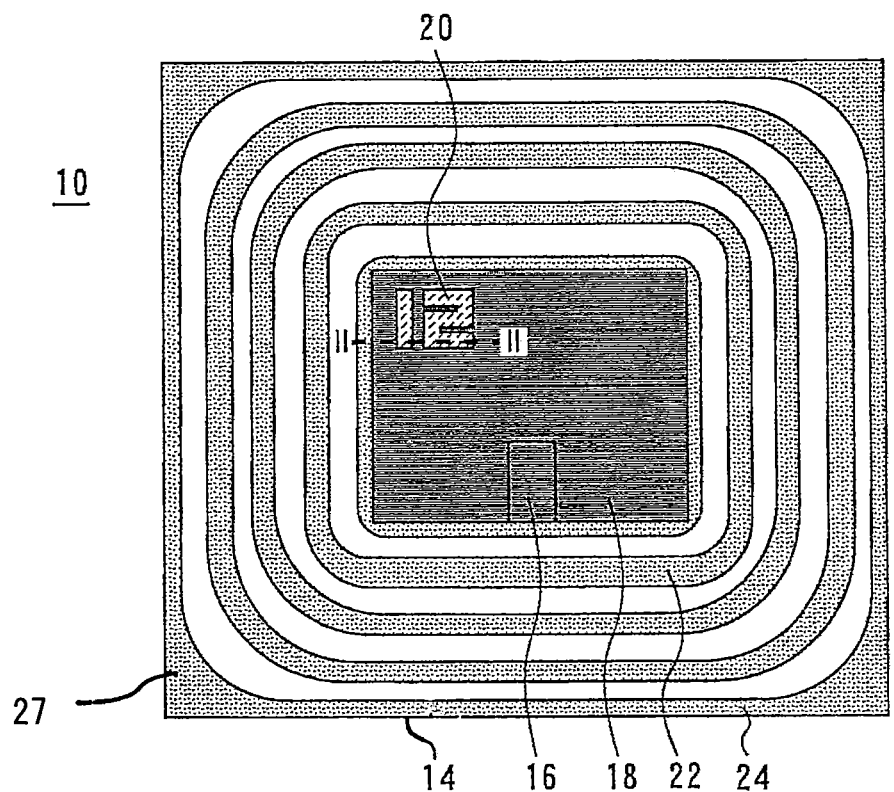
F I G. 1
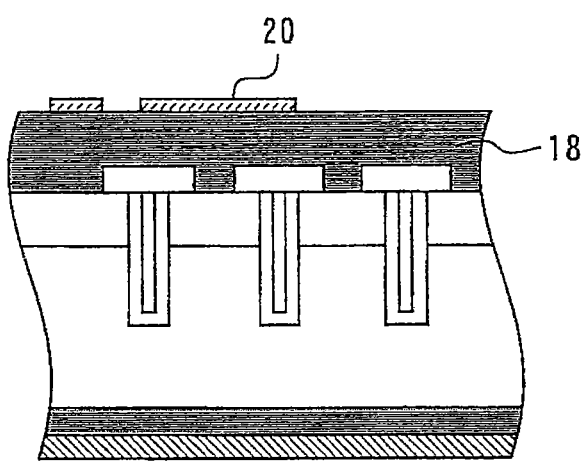
F I G. 2

SEMICONDUCTOR DEVICE

BACKGROUND OF THE INVENTION

1. Field of the Invention

The present invention relates to a semiconductor device having a portion indicative of identification data such as a lot number.

2. Background Art

Semiconductor devices have formed on their surface a portion indicative of identification data such a lot number, a wafer address, or a serial number, which portion is hereinafter referred to as an ID-indicating portion. The ID-indicating portion is used to manage the process histories, etc. of semiconductor devices.

The ID-indicating portion is formed on the so-called ineffective region of the semiconductor device. An ineffective region is an area formed around the outer circumferences of the electrodes and circuit patterns of a semiconductor device to protect these components. The area of the ineffective region is typically small in order to reduce the size of the semiconductor device. Japanese Laid-Open Patent Publication No. 2004-72075 discloses a semiconductor device in which an ID-indicating portion is formed on the ineffective region.

The smaller the area of the ineffective region, the smaller the ID-indicating portion which can be formed thereon. It should be noted that ineffective regions are usually relatively small in area, as described above. This means that it is difficult or impossible to form a large ID-indicating portion on an ineffective region. If the ID-indicating portion formed on the ineffective region is small, its visibility is low (i.e., it is hard to visually recognize the ID represented by the ID-indicating portion), thus making it difficult to manage the process histories of semiconductor devices.

SUMMARY OF THE INVENTION

The present invention has been made to solve this problem. It is, therefore, an object of the present invention to provide a semiconductor device having an ID-indicating portion which is formed by a simple method and which has good visibility.

According to one aspect of the present invention, a semiconductor device includes a semiconductor substrate, a surface electrode formed on the semiconductor substrate, an ineffective region formed to surround the surface electrode, and an ID-indicating portion made of a different material than the surface electrode and formed on the surface electrode to indicate an ID. The area of the ineffective region is smaller than the area of the surface electrode.

According to another aspect of the present invention, a semiconductor device includes a semiconductor substrate, a surface electrode formed on the semiconductor substrate, an inorganic thin film formed on the surface electrode, an ineffective region formed to surround the surface electrode, and an ID-indicating portion of metal formed on the inorganic thin film to indicate an ID. The area of the ineffective region is smaller than the area of the surface electrode.

Other and further objects, features and advantages of the invention will appear more fully from the following description.

BRIEF DESCRIPTION OF THE DRAWINGS

FIG. 1 is a plan view of an IGBT in accordance with a first embodiment of the present invention;

FIG. 2 is a cross-sectional view taken along dashed line II-II of FIG. 1;

DETAILED DESCRIPTION OF THE PREFERRED EMBODIMENTS

First Embodiment

Figure 3:
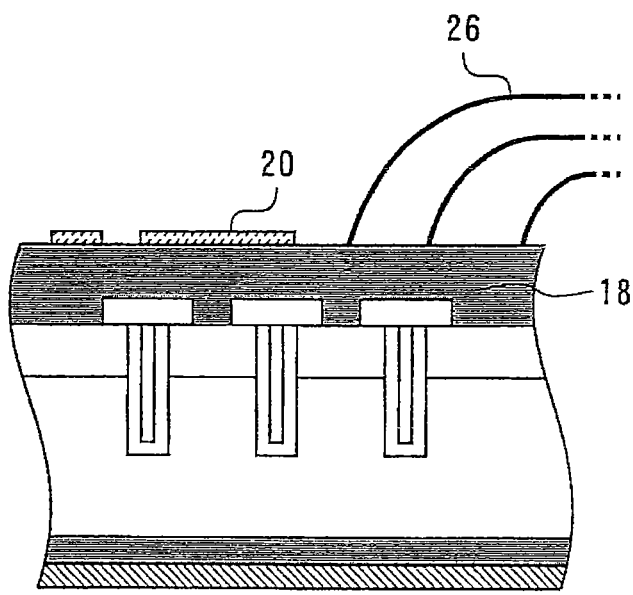
FIG. 3 is another cross-sectional view of the IGBT of the first embodiment, showing the way in which the IGBT is connected to an external component.

FIG. 1 is a plan view of an IGBT 10 in accordance with a first embodiment of the present invention. The IGBT 10 includes a semiconductor substrate 14. The semiconductor substrate 14 has a gate electrode 16 and an emitter electrode 18 formed thereon (which electrodes may be hereinafter referred to collectively as the "surface electrode"). The surface electrode is made of Al. An ID-indicating portion 20 is formed on the emitter electrode 18. The ID-indicating portion 20 indicates the ID code of the IGBT 10, namely, 12. The ID-indicating portion 20 is made up of lines having a width of approximately 100 µm. Although in the present embodiment the ID-indicating portion 20 is formed of Cu, it may be any suitable metal thin film other than Al.

Guard rings 22 are formed in the semiconductor substrate 14 and encircle the surface electrode. Each guard ring 22 includes a semiconductor layer (formed in the semiconductor substrate 14) and a conductor formed on the semiconductor layer. A channel stopper 24 is formed along the outer periphery of the IGBT 10 and encircles the guard rings 22.

FIG. 2 is a cross-sectional view taken along dashed line II-II of FIG. 1. That is, FIG. 2 includes a cross-section of the ID-indicating portion 20. The ID-indicating portion 20 is formed on a portion of the emitter electrode 18. The emitter electrode 18 has a film thickness of 3 µm. FIG. 3 is another cross-sectional view of the IGBT 10 of the first embodiment, showing the way in which the IGBT 10 is connected to an external component. Wires 26 are bonded to the emitter electrode 18 to provide external connection to the electrode.

Figure 4:
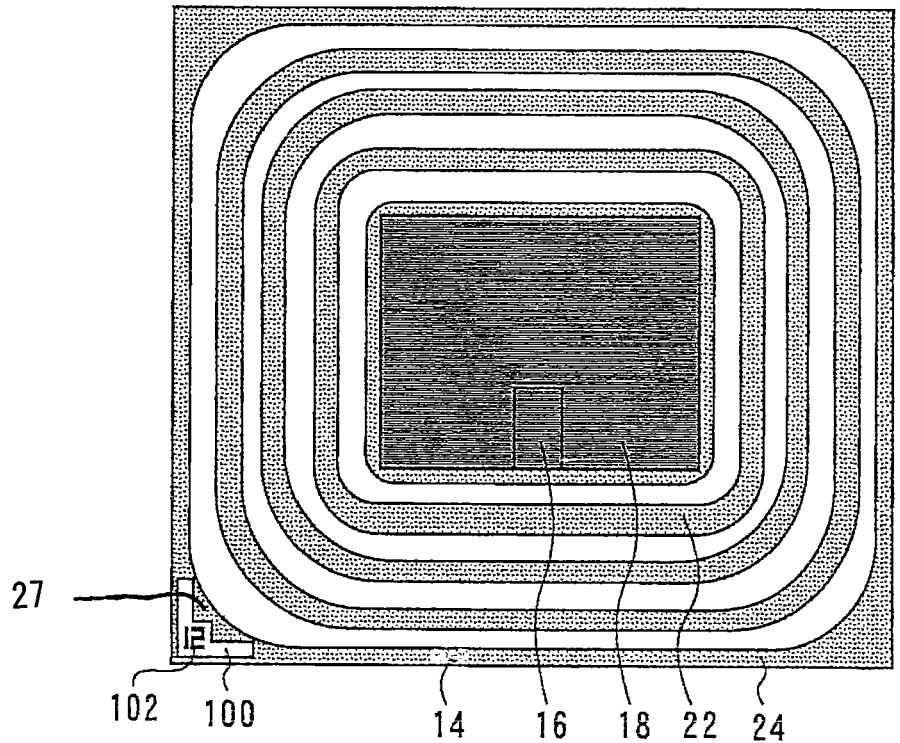
FIG. 4 is a plan view of this comparative IGBT.

Before describing the advantages of the IGBT 10 of the first embodiment, and to facilitate the understanding thereof, the following description will be directed to a comparative conventional IGBT. FIG. 4 is a plan view of this comparative IGBT. In this IGBT, an opening 100 is formed at a corner of the channel stopper 24. An ID-indicating portion 102 is formed in this opening 100.

Incidentally, the surface of an IGBT can be divided into two regions: the effective region provided with the surface electrode; and the ineffective region 27 provided with the guard rings 22 and the channel stopper 24. In the comparative IGBT, the ID-indicating portion 102 is formed in the ineffective region. In this case, however, the ID-indicating portion 102 should not overlap the guard rings 22. This means that only very narrow surface areas of the ineffective region are available for the formation of the ID-indicating portion 102 although the entire area of the ineffective region itself is large, thus limiting the dimensions and hence the visibility of the ID-indicating portion 102.

On the other hand, the construction of the IGBT 10 of the first embodiment allows the formation of an ID-indicating portion having high visibility. Specifically, in the IGBT 10 of the first embodiment, the ID-indicating portion 20 is formed on the wide flat surface of the emitter electrode 18. As a result, the ID-indicating portion 20 can be of a large size, resulting in high visibility. Generally, lines having a width of not less than 100 μm can be readily visible to the naked eye (or under a low power microscope). Since the lines forming the ID-indicating portion 20 is approximately 100 μm wide, the ID-indicating portion 20 has good visibility.

Further, the ID-indicating portion 20 can be formed anywhere on the emitter electrode 18 except for the area where the wires 26 are connected to the emitter electrode 18; that is, the IGBT 10 of the present embodiment offers a high degree of freedom in choosing the location of the ID-indicating portion 20. Therefore, the ID-indicating portion 20 can be disposed to be readily visible.

Further, since the ID-indicating portion 20 is formed of metal other than Al, it is conspicuous on the surface electrode, which is made of Al. This further enhances the visibility of the ID-indicating portion 20.

Since in the IGBT 10 of the first embodiment the ID-indicating portion 20 is formed on the emitter electrode 18, there is a reduced available area on the emitter electrode 18 where the wires 26 can be connected to the emitter electrode 18. This may result in the wires 26 being connected to the surface of the emitter electrode 18 at closely spaced points, which may result in an increase in the resistance of the current path through the emitter electrode 18. However, the construction of the IGBT 10 of the first embodiment prevents this increase in resistance. Specifically, since the emitter electrode 18 has a relatively large thickness (namely, 3 μm), the resistance of the lateral current path in the emitter electrode 18 is low. That is, even when the wires 26 are connected to the surface of the emitter electrode 18 at relatively closely spaced points, the current path through the emitter electrode 18 has a low resistance if the electrode 18 has a thickness of at least 3 μm.

Figure 5:
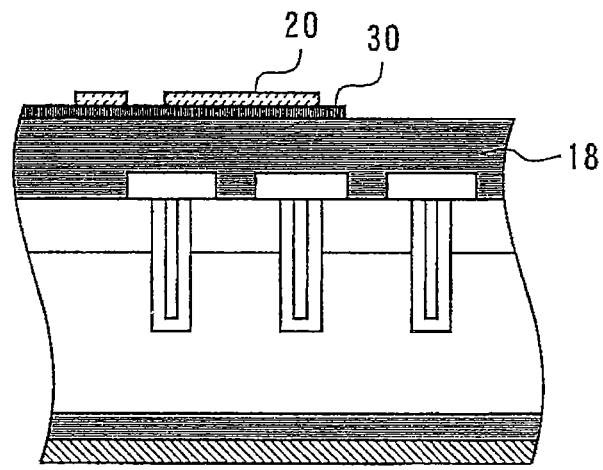
FIG. 5 is a cross-sectional view of a variation of the IGBT of the first embodiment.

FIG. 5 is a cross-sectional view of a variation of the IGBT of the first embodiment. In this IGBT, the ID-indicating portion 20 is formed on a nitride film 30 on the emitter electrode 18. Since the ID-indicating portion 20 is a metal thin film, it is more conspicuous on the underlying nitride film 30 than on the emitter electrode 18, resulting in enhanced visibility of the ID-indicating portion 20. It should be noted that the ID-indicating portion 20, which is a metal thin film, is also conspicuous on other inorganic thin films in addition to the nitride film 30. Therefore, the ID-indicating portion 20 may be formed on an inorganic thin film such as an SiO film to improve the visibility of the ID-indicating portion 20.

Although in the present embodiment the surface electrode is made of Al, it is to be understood that the present invention is not limited to this material. The surface electrode may be made of any other suitable metal material such as AlSi.

The manufacturing process of an IGBT typically includes forming a nitride film serving as a passivation film. Therefore, the ID-indicating portion may be formed in this film forming process, in which case the ID-indication portion is made of a nitride film (not a metal thin film other than Al). In this way the ID-indication portion can be formed without requiring an additional process.

The manufacturing process of an IGBT also typically includes forming polyimide. Therefore, the ID-indicating portion may be formed in this polyimide forming process, in which case the ID-indicating portion is made of polyimide (not a metal thin film other than Al). In this way the ID-indication portion can be formed without requiring an additional process.

The IGBT 10 of the first embodiment is characterized in that the ID-indicating portion is formed on the wide flat surface of the surface electrode. This allows the size of the ID-indicating portion to be increased. The reason for this is that in this IGBT the surface area of the surface electrode is larger than the available surface area of the ineffective region. Such semiconductor devices include, in addition to IGBTs, vertical MOSFETs and diodes.

Second Embodiment

Figure 6:
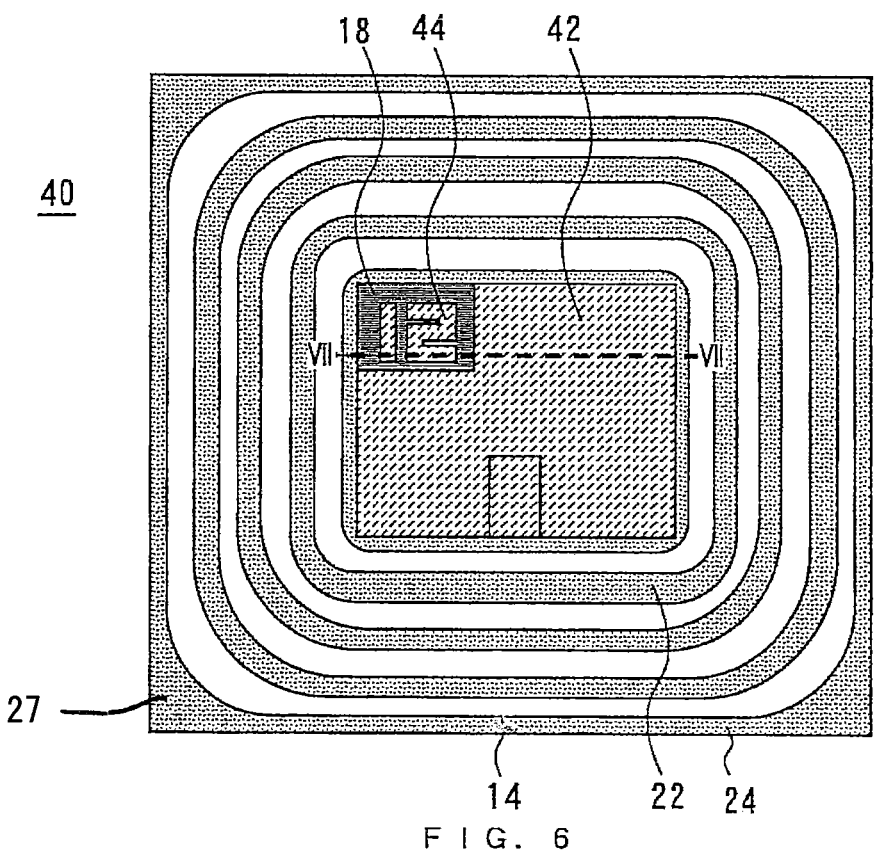
FIG. 6 is a plan view of an IGBT in accordance with a second embodiment of the present invention.
Figure 7:
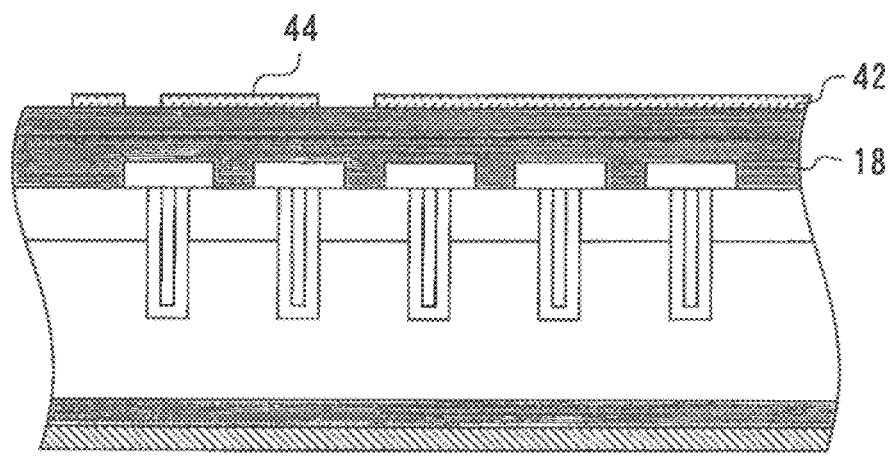
FIG. 7 is a cross-sectional view taken along line VII-VII of FIG. 6.

FIG. 6 is a plan view of an IGBT 40 in accordance with a second embodiment of the present invention. A soldering portion 42 and an ID-indicating portion 44 are formed on the surface electrode of the IGBT 40. The soldering portion 42 is where the lead frame is soldered to the IGBT. The soldering portion 42 and the ID-indicating portion 44 are formed of the same type of solderable material. FIG. 7 is a cross-sectional view taken along line VII-VII of FIG. 6. That is, FIG. 7 includes cross-sections of the soldering portion 42 and the ID-indicating portion 44. The soldering portion 42 and the ID-indicating portion 44 are formed at different locations on the emitter electrode 18. It should be noted that the emitter electrode 18 has a film thickness of 3 μm.

Figure 8:
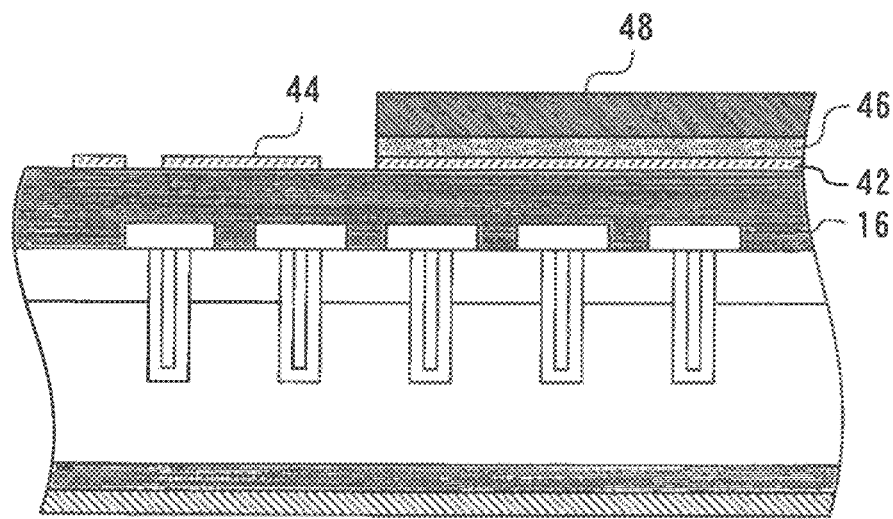
FIG. 8 is a cross-sectional view of the IGBT of the second embodiment, showing the way in which the IGBT is connected to an external component.

FIG. 8 is a cross-sectional view of the IGBT 40 of the second embodiment, showing the way in which the IGBT 40 is connected to an external component. Specifically, a lead frame 48 is bonded to the soldering portion 42 by solder 46.

In the construction of the IGBT 40, the ID-indicating portion 44 formed on the emitter electrode 18 can be of a large size, allowing the IGBT 40 to have the same advantages as described in connection with the IGBT 10 of the first embodiment. Further, the ID-indicating portion 44 can be formed in the same process as the soldering portion 42. Thus the ID-indicating portion 44 can be formed without requiring an additional process. It should be noted that the IGBT 40 is susceptible of alterations which are the same as or correspond to those that can be made to the first embodiment.

The soldering portion 42 and the ID-indicating 44 may be made of any solderable material. Suitable examples of solderable materials include Ti—Ni—Au, Ti—Ni—Ag, Mo—Ni—Au, Mo—Ni—Ag, V—Ni—Au, V—Ni—Ag, TiW—Ni—Au, and TiW—Ni—Ag.

Thus the present invention provides a simple way to form an ID-indicating portion having good visibility.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-129535, filed on Jun. 7, 2010 including specification, claims, drawings and summary, on which the Convention priority of the present application is based, are incorporated herein by reference in its entirety.

What is claimed is:
1. A semiconductor device comprising:
a semiconductor substrate;
a surface electrode formed on said semiconductor substrate;

an ineffective region formed to surround said surface electrode in plan view to protect at least said surface electrode; and an ID-indicating portion made of a different material than said surface electrode and formed on said surface electrode to indicate an ID, wherein a top surface of the ID-indicating portion and a portion of a top surface of the surface electrode are uncovered.

2. The semiconductor device according to claim 1, further comprising:

a guard ring formed inward of said ineffective region in the plan view; and a wire bonded to said surface electrode.

3. The semiconductor device according to claim 1, further comprising:

a soldering portion of solderable material formed on said surface electrode; and a lead frame bonded to said soldering portion by solder, wherein said ID-indicating portion is formed of a same material as said soldering portion.

4. The semiconductor device according to claim 1, wherein:

said surface electrode is formed of Al; and said ID-indicating portion is formed of a nitride film, polyimide, or aluminum-containing material.

5. The semiconductor device according to claim 1, wherein said surface electrode has a thickness of at least 3 μm.

6. The semiconductor device according to claim 1, wherein said surface electrode is an electrode of an IGBT, vertical MOSFET, or diode.

7. A semiconductor device comprising:

a semiconductor substrate;

a surface electrode formed on said semiconductor substrate;

an ineffective region formed to surround said surface electrode in plan view to protect at least said surface electrode;

an ID-indicating portion made of a different material than said surface electrode and formed on said surface electrode to indicate an ID;

a soldering portion of solderable material formed on said surface electrode; and a lead frame bonded to said soldering portion by solder, wherein said ID-indicating portion is formed of a same material as said soldering portion.

* * * * *